United States Patent
Korovin et al.

(10) Patent No.: US 11,831,405 B2
(45) Date of Patent: Nov. 28, 2023

(54) ADAPTIVE FILTERING FOR PRECISION TIME PROTOCOL WITH PHYSICAL LAYER SUPPORT

(71) Applicant: Renesas Electronics America Inc., Milpitas, CA (US)

(72) Inventors: Oleksandr Korovin, Ottawa (CA); Alexandru Mihut, Ottawa (CA); Greg Anton Armstrong, Ottawa (CA); Leonid Goldin, Ottawa (CA)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 17/692,762

(22) Filed: Mar. 11, 2022

(65) Prior Publication Data

US 2023/0291490 A1    Sep. 14, 2023

(51) Int. Cl.
*H04J 3/06* (2006.01)
*H04L 43/08* (2022.01)
*H04J 3/02* (2006.01)

(52) U.S. Cl.
CPC ............ *H04J 3/0667* (2013.01); *H04J 3/025* (2013.01); *H04J 3/0617* (2013.01)

(58) Field of Classification Search
CPC ......... H04J 3/0667; H04J 3/025; H04J 3/0617
See application file for complete search history.

(56) References Cited

U.S. PATENT DOCUMENTS

| | | | |
|---|---|---|---|
| 9,276,591 B2 * | 3/2016 | Hadzic | H03L 7/087 |
| 9,444,566 B1 * | 9/2016 | Mustiere | H04J 3/0667 |
| 2007/0223459 A1 * | 9/2007 | Crowle | H04J 3/0664 370/353 |
| 2010/0158181 A1 * | 6/2010 | Hadzic | H03L 7/085 375/371 |
| 2011/0199941 A1 * | 8/2011 | Ouellette | H04L 12/1836 370/256 |
| 2012/0099432 A1 * | 4/2012 | Bercovich | H04J 3/0658 370/235 |
| 2014/0153591 A1 * | 6/2014 | Bedrosian | H04J 3/0658 370/517 |
| 2016/0095075 A1 * | 3/2016 | Bin Sediq | H04W 56/001 370/350 |
| 2018/0145781 A1 * | 5/2018 | Chaloupka | H04J 3/0644 |
| 2018/0145863 A1 * | 5/2018 | Chaloupka | H04L 67/01 |
| 2019/0036804 A1 * | 1/2019 | Mihelic | H04J 3/0697 |

\* cited by examiner

*Primary Examiner* — Bailor C Hsu
(74) *Attorney, Agent, or Firm* — SCULLY, SCOTT, MURPHY &PRESSER, P.C.

(57) ABSTRACT

Systems and methods for reducing phase delay variation impact are described. A microcontroller can receive a sequence of phase offsets determined by a slave device over time. The microcontroller can determine a weight vector based on a metric associated with the sequence of phase offsets. The microcontroller can adjust a set of filter coefficients based on the weight vector. The set of filter coefficients can be filter coefficients of a filter being implemented by the slave device to filter incoming packet data.

20 Claims, 7 Drawing Sheets

ADAPTIVE FILTERING FOR PRECISION TIME PROTOCOL WITH PHYSICAL LAYER SUPPORT

BACKGROUND OF THE SPECIFICATION

The present disclosure relates in general to integrated circuit devices and, more particularly, to adaptive filtering for precision time protocol with physical layer support in clock synchronization circuits.

IEEE 1588, also known as Precision Time Protocol (PTP), is a standard that defines the distribution of timing over packet switched networks. Timestamps are exchanged over the packet switched network between a master device and one or more slave devices. The master device can be linked to a primary reference clock (e.g., a known time), such that timestamps of the master device can reference a known time. The slave device is not linked to any known time, which causes the slave device timestamps to reference a slave device clock that may be different from the primary reference clock. The slave device clock can be calculated by the slave device using an algorithm (e.g., a clock servo), and the calculation can be based on timing parameters such as delays, round trip times, etc., of packet data being exchanged between the master device and the slave device.

SUMMARY

In an embodiment, an integrated circuit for reducing packet delay variation impact is generally described. The integrated circuit can include a microcontroller. The microcontroller can be configured to receive a sequence of phase offsets determined by a slave device over time. The microcontroller can be further configured to determine a weight vector based on a metric associated with the sequence of phase offsets. The microcontroller can be further configured to adjust a set of filter coefficients based on the weight vector, wherein the set of filter coefficients are filter coefficients of a filter being implemented by the slave device to filter incoming packet data.

In another embodiment, a device for reducing packet delay variation impact is generally described. The device can include a physical layer and a microcontroller configured to be in communication with the physical layer. The physical layer can be configured to receive packet data from a network. The microcontroller can be configured to receive a sequence of phase offsets determined by a slave device over time. The microcontroller can be further configured to determine a weight vector based on a metric associated with the sequence of phase offsets. The microcontroller can be further configured to adjust a set of filter coefficients based on the weight vector, wherein the set of filter coefficients are filter coefficients of a filter being implemented by the slave device to filter incoming packet data.

In another embodiment, a method for reducing packet delay variation impact is generally described. The method can include receiving a sequence of phase offsets determined by a slave device over time. The method can further include determining a weight vector based on a metric associated with the sequence of phase offsets. The method can further include adjusting a set of filter coefficients based on the weight vector. The set of filter coefficients can be filter coefficients of a filter being implemented by the slave device to filter incoming packet data.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Network traffic in packet switched networks may be inconsistent and causes PTP timestamp noise to be inconsistent as well. The noise inconsistency over time can be represented as packet delay variation, where packet delay variation refers to differences between delays of significant packets in a flow around their ideal position. The systems and methods described herein provides adaptive filtering that can be implemented by the clock servo of a slave device to suppress packet delay variation impact caused by network traffic. In an aspect, a combination of a physical layer clock and an IEEE 1588 clock can be implemented in the slave device to synchronize frame or timing pulses. The adaptive filtering being described herein can be implemented in addition to the physical layer clock support to suppress packet delay variation impact and to improve accuracy of the slave device clock.

Figure 1:
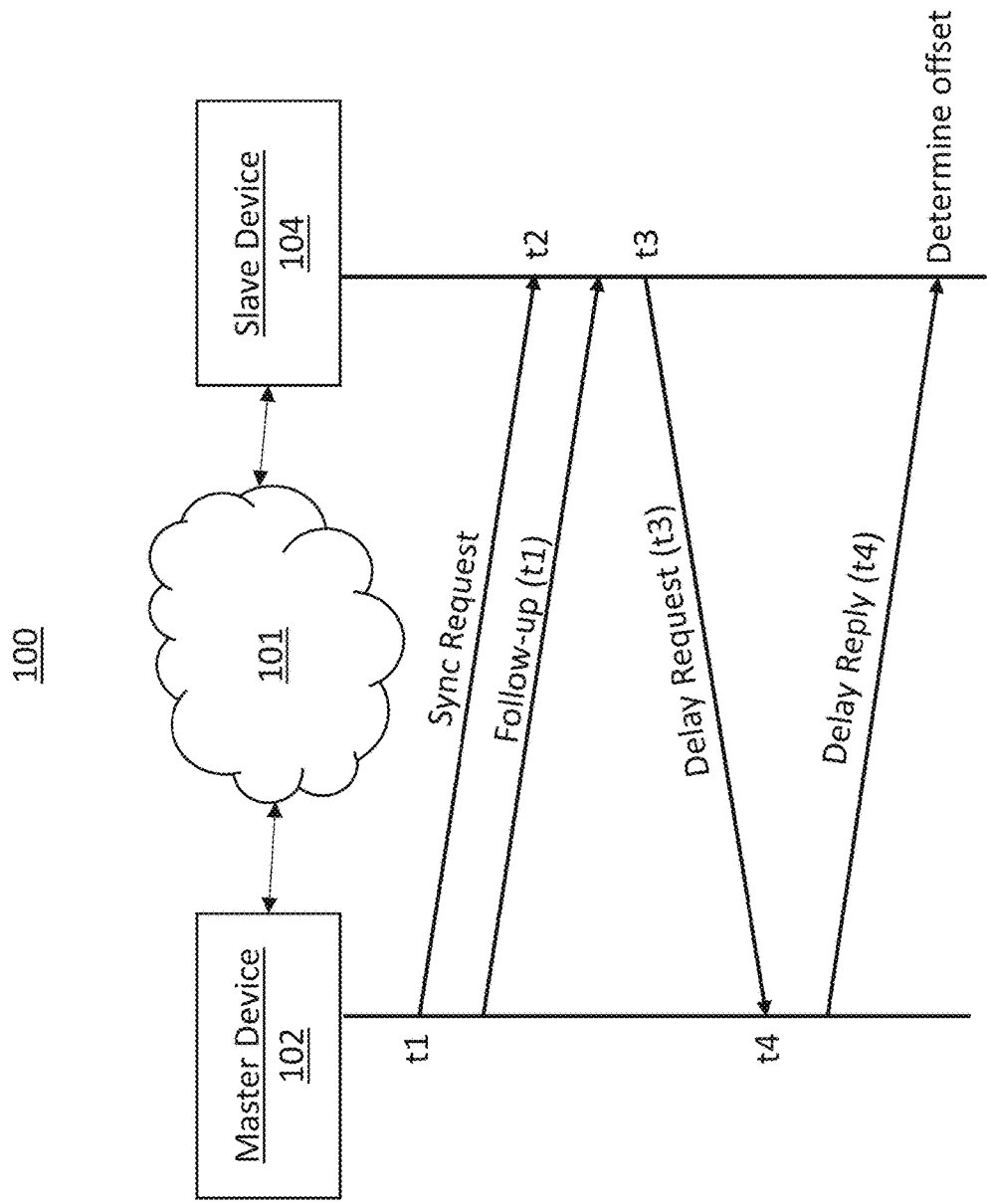
FIG. 1 is a block diagram of an example system for adaptive filtering for precision time protocol with physical layer support in one embodiment.

FIG. 1 is a block diagram of an example system 100 for adaptive filtering for precision time protocol with physical layer support in one embodiment. System 100 can be a network including a master device 102 and a slave device 104 (or slave device 104) configured to be in communication with one another through a network 101. Network 101 can be a packet switched network. Slave device 104 can be among a plurality of slave devices configured to communicate with master device 102 through network 101. Master device 102 can be connected to a grandmaster clock, or a primary reference time clock, which can be a known clock source (e.g., Global Navigation Satellite System (GNSS), Global Positioning System (GPS), etc.). An example in FIG. 1 illustrates a synchronization process that allows master device 102 and slave device 104 to exchange timestamps t1, t2, t3, t4 in order for slave device 104 to determine an offset. The offset can be used for adjusting a slave device clock of slave device 104, where the slave device clock is generated by clock generators such as a disciplined oscillator. The synchronization process shown in FIG. 1 can be repeatedly performed between master device 102 and slave device 104 in order for slave device 104 to continuously adjust its slave device clock.

The synchronization process can begin with master device 102 sending a sync request at a time t1, where time t1 can be referencing a known time. Slave device 104 can receive the sync request at a time t2, where time t2 can be referencing a slave device clock that can be different from the primary reference clock. The primary reference clock is unknown to slave device 104 and the slave device clock is unknown to master device 102. Master device 102 can further send a follow-up signal encoding time t1 in order for slave device 104 to obtain t1 (or two-step port). Slave device 104 can send a delay request to master device 102 at a time t3 that references the slave device clock. Master device 102 can receive the delay request at a time t4 that references a known time. Master device 102 can respond to the delay request by sending a delay reply encoding time t4 to slave device 104. In response to slave device 104 receiving time t4, slave device 104 has knowledge of times or timestamps t1, t2, t3, t4. Slave device 104 can use times t1, t2, t3, t4 to calculate or determine a phase offset and the delay between the primary reference clock of master device 102 with its slave device clock, and adjust the slave device clock based on the determined phase offset.

In an aspect, network traffic in packet switched network 101 can be inconsistent and the noise resulting from these network traffic can affect the timestamps t2 and t4. Due to the network traffic, slave clock phase offsets calculated from different instances of the synchronization process shown in FIG. 1 can be different. The variation between these phase offsets can be referred to as packet delay variation. Excessive packet delay variation can cause instability of slave device 104. Therefore, it may be desirable to suppress packet delay variation in order to stabilize slave device 104.

To be described in more detail below, slave device 104 can implement a clock servo that can adaptively filter noise from incoming packet data, or packet data being received by slave device 104. The adaptive filtering performed by slave device 104 can be based on, for example, a quality of a set of sampled packets. For example, packets having relatively low packet data variation can be considered as samples with good accuracy, and filter coefficients corresponding to these samples with good accuracy may not need drastic changes or adjustments. On the contrary, filter coefficients corresponding to samples that are inaccurate, or having relatively large packet delay variation, may be adjusted to adapt to the fluctuation of packet delay variations. The adaptive filtering described herein can allow slave device 104 to use a filter that adapts to different sample size, different packet quality, different packet delay variations, instead of using a fixed linear filter that may be suitable for a limited number of sample packets and quality.

Figure 2:
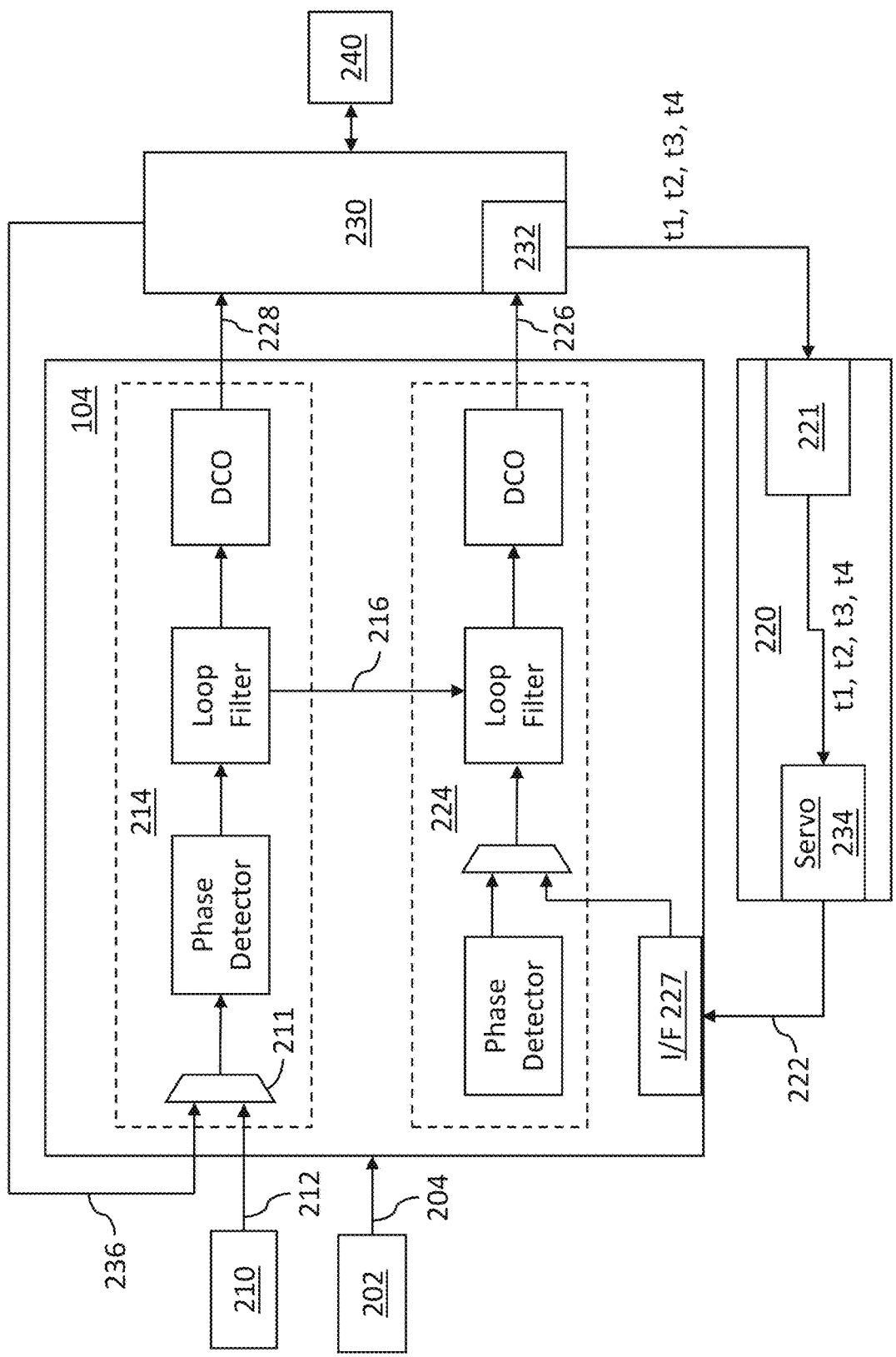
FIG. 2 is a block diagram illustrating details of a slave device that can implement adaptive filtering for precision time protocol with physical layer support in one embodiment.

FIG. 2 is a block diagram illustrating details of slave device 104 that can implement adaptive filtering for precision time protocol with physical layer support in one embodiment. Slave device 104 can be connected to an electronic oscillator circuit 202 (e.g., a crystal oscillator) configured to generate a system clock 204 for slave device 104. Slave device 104 can include a DPLL module 214 and a DPLL module 224. DPLL module 214 can be connected to an external clock 210. External clock 210 can provide a physical reference clock signal 212 to DPLL module 214.

In one embodiment, DPLL module 214 can receive a physical clock signal 236 from a physical layer 230 configured to be in communication with slave device 104 and a network 240. In one embodiment, physical layer 230 can be a synchronous ethernet (SyncE) physical layer and network 240 can be a SyncE network. Physical layer 230 can receive packet data from a master device (e.g., master device 102 in FIG. 1) connected to network 240, and assign timestamps (e.g., t1, t4 in FIG. 1) that reference clock signal 226. In one embodiment, physical layer 230 can provide a SyncE reference clock signal 236 to DPLL module 214 as an alternative reference clock signal (e.g., alternative to physical reference clock signal 212) for DPLL module 214.

In one embodiment, DPLL module 214 can include a selection circuit (e.g., a multiplexer) 211 that can select either system physical reference clock signal 212 or SyncE reference clock signal 236 to be inputted to a phase detector of DPLL 214. DPLL 214 can generate a frequency offset correction signal 216 and a SyncE clock signal 228 based on the reference clock signal selected by selection circuit 211. DPLL 214 can be configured to output frequency correction signal 216 (e.g., a fractional frequency offset (FFO) correction signal) to DPLL module 224. Frequency offset correction signal 216 and SyncE clock signal 228 can be frequency locked to either physical reference clock signal 212 or SyncE reference clock signal 236 depending on the selection made by selection circuit 211. Frequency offset correction signal 216 can be used for stabilizing a digital controlled oscillator (DCO) in DPLL module 224.

Slave device 104 can be configured to be in communication with a processing element, such as a microcontroller 220. Microcontroller 220 can be configured to be in communication with physical layer 230. Microcontroller 220 can be configured to implement an algorithm, or clock servo 234. Clock servo 234 can include a sequence of operations to perform adaptive filtering (described below) to generate a correction signal 222 for slave device 104. Slave device 104 can receive correction signal 222 from microcontroller 220 via a serial interface (UF) 227. Correction signal 222 can be a phase correction signal or a frequency correction signal. DPLL module 224 can generate a clock signal 226 and a 1-PPS timing pulse may accompany clock signal 226. Clock signal 226 can be a recovered clock of slave device 104, and can be generated based on correction signal 222 and frequency correction signal 216. In one embodiment, SyncE clock signal 228 can be a frequency clock signal that can synchronize clock signal 226 at physical layer 230. In one embodiment, physical layer 230 can include a time stamp block 232 configured to generate time stamps of packets based on clock signal 226. Time stamp block 232 can provide time stamps, such as t1, t2, t3, t4 to a protocol stack 221 of microcontroller 220. Protocol stack 221 can be an IEEE 1588 protocol stack.

Figure 3:
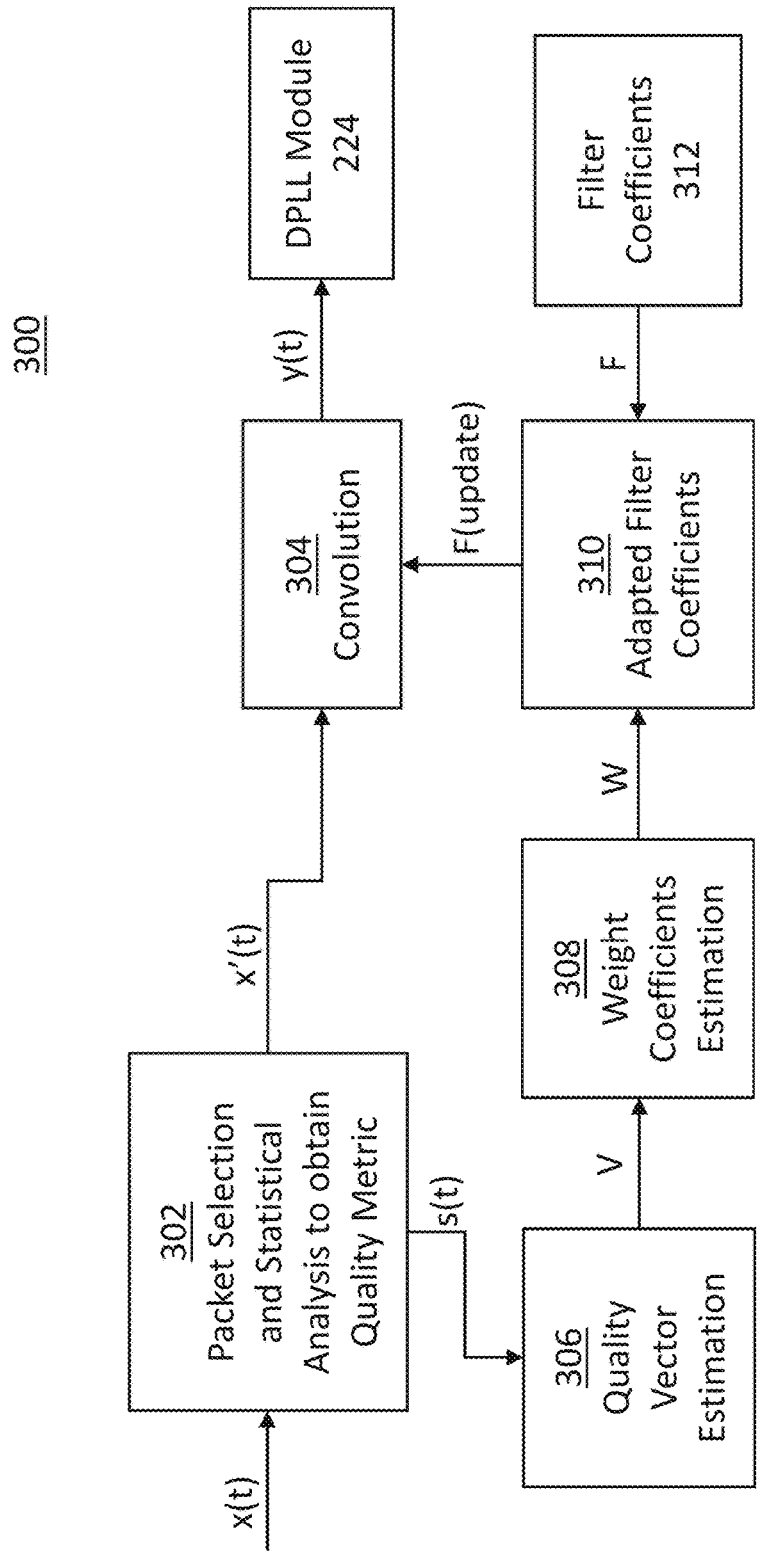
FIG. 3 is a block diagram illustrating an example implementation of adaptive filtering for precision time protocol with physical layer support in one embodiment.

FIG. 3 is a block diagram illustrating an example implementation of adaptive filtering for precision time protocol with physical layer support in one embodiment. An example process 300 shown in FIG. 3 can be implemented by microcontroller 220 of FIG. 2, and process 300 can be a sequence of operations among clock servo 234. Process 300 can begin at block 302. At block 302, microcontroller 220 can receive a packet time error sequence x(t), where x(t) can represent phase offsets or delays determined by slave device 104 over time. Microcontroller 220 can perform packet selection and statistical analysis on input x(t).

Figure 4:
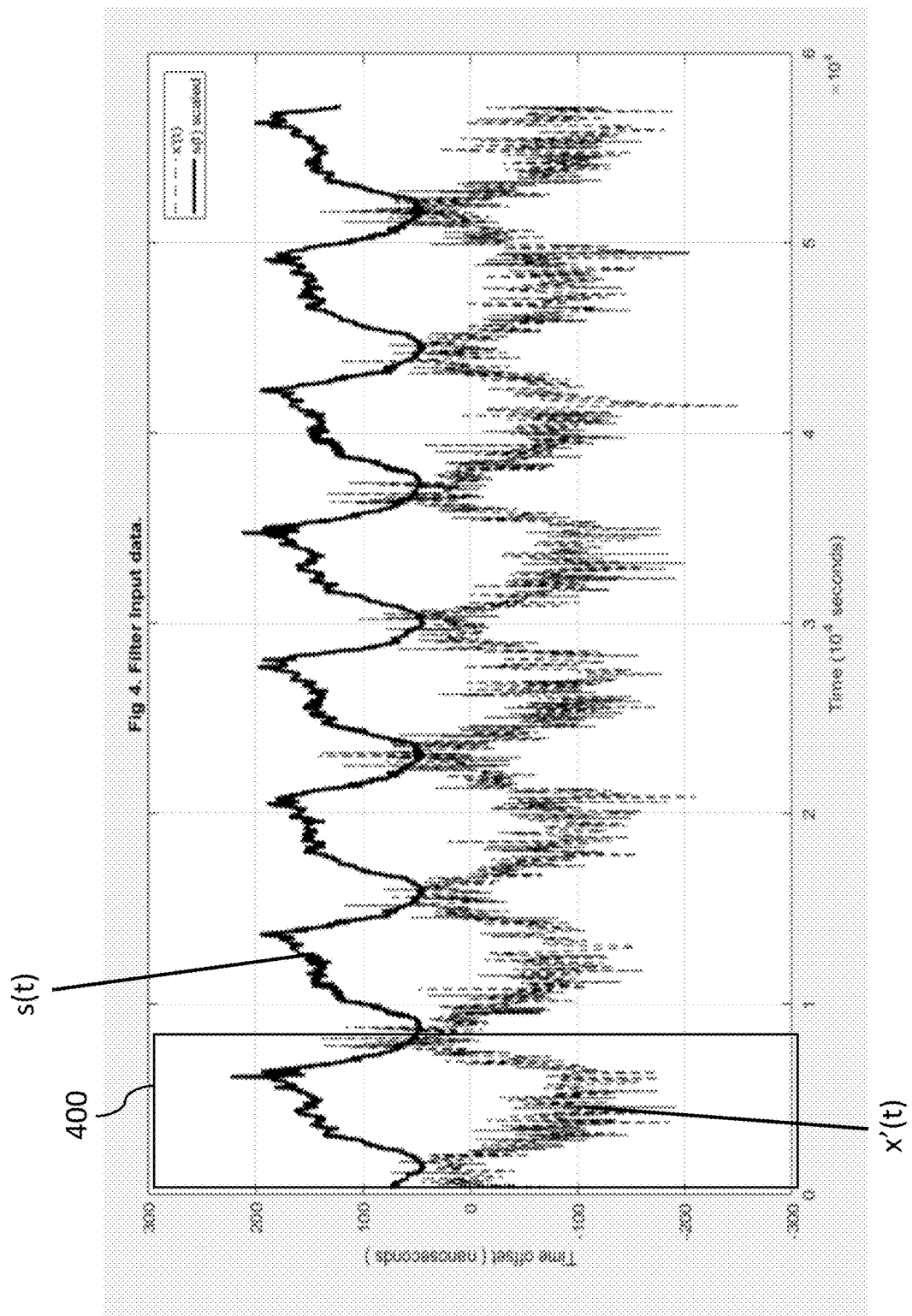
FIG. 4 is a diagram illustrating an example set of packet samples that can be used for implementing adaptive filtering for precision time protocol with physical layer support in one embodiment.

In one embodiment, microcontroller 220 can execute a sliding window algorithm to perform the packet selection process in block 302. A size of a sliding window being used for the packet selection process can be based on physical layer support being implemented on slave device 104. For example, if physical layer 230 of slave device 104 is a SyncE physical layer, based on SyncE frequency stability being $1e$-11 hertz (Hz), a 10,000 seconds window can limit SyncE inaccuracy related time error to approximately 100 nanoseconds. Referring to FIG. 4, a sliding window 400 can have a size of 10,000 seconds. Microcontroller 220 can obtain a selected packet time error sequence x'(t), representing a subset of phase offsets, by extracting a portion of x(t) that is within the sliding window 400. Block 302 can output selected packet time error sequence x'(t) to a convolution block 304.

Further, at block 302, microcontroller 220 can perform various statistical analysis on x(t) to obtain a statistical result, denoted as s(t), representing a quality metric. The statistical analysis being performed by microcontroller 220 can include algorithms for determining packet data probability distribution, confidence interval, variance, standard deviation, other metrics, a combination of these metrics, etc. In the example shown in FIG. 4, s(t) is a function that varies over time t, and represents a sum of uplink (e.g., traffic from slave to master) and downlink (e.g., traffic from master to slave) variance. In one embodiment, s(t) can be stored in a first in first out (FIFO) buffer of slave device 104.

Process 300 can proceed from block 302 to block 306 by outputting s(t) to block 306. At block 306, microcontroller 220 can determine a quality vector denoted as V based on quality metric s(t). In one embodiment, microcontroller 220 can sample values of s(t), stored in FIFO buffer, within sliding window 400 to form quality vector V, where the sampled values of s(t) become elements $V_i$ of quality vector V, where i varies from 1 to k and k denotes a number of samples among quality vector V. In one embodiment, a sampling rate to sample s(t) can be based on a desired implementation of client device 104. Some example sampling rates can include, but not limited to, 128, 64, 32, 16, or 8 samples per second. In one embodiment, if there are insufficient samples available to fit withing sliding window 400, zero samples (e.g., setting $V_i$=0) with average variance can be used to replace missing samples and to fill up the number of samples to meet the number of samples defined by sliding window 400, essentially reducing a size of sliding window 400 to a real buffer size.

Process 300 can proceed from block 306 to block 308 by providing quality vector V to block 308. At block 308, microcontroller 220 can perform weight coefficients estimation to determine a weight coefficient vector W based on quality vector V. Microcontroller 220 can normalize quality vector V based on a minimum value of quality vector V (denoted as min(V)), and a mean value of V (denoted as mean(V)). For example, microcontroller 220 can use the following relationship to normalize quality vector V:

$$V_i(\text{norm})=(V_i-\min(V))/(\text{mean}(V)-\min(V))$$

where $V_i$ denotes an i-th element of quality vector V, and $V_i$(norm) denotes the i-th element of a normalized quality vector V(norm).

In response to determining V(norm), microcontroller 220 can saturate V(norm) using the following relationship:

$$V_i(sat)=\text{satuate}(V_i(\text{norm}),0,1)$$

where $V_i$(sat) denote the i-th element of saturated V(norm), or V(sat). In one embodiment, the saturate function for obtaining $V_i$(sat) can return a zero for values of $V_i$(norm) that is less than zero, can return a one for values of $V_i$(norm) that is greater than one, and can return the value of $V_i$(norm) otherwise.

Microcontroller 220 can determine weight coefficient vector W based on V(sat). In one embodiment, microcontroller 220 can apply a cosine function on a product of V(sat) and a factor n to determine weight coefficient vector W, such as:

$$W=\cos(\pi * V(sat))$$

Figure 5:
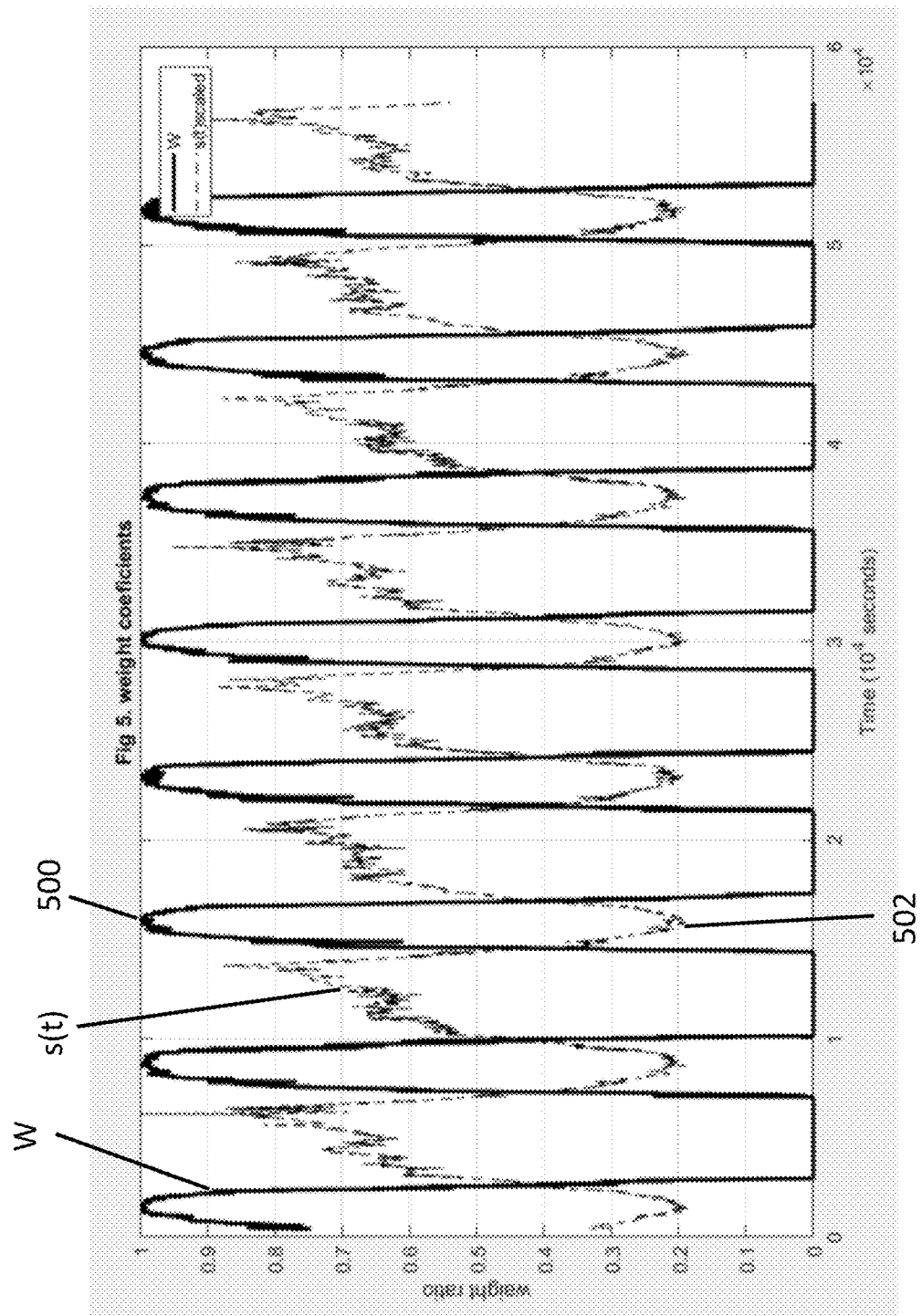
FIG. 5 is a diagram illustrating an example set of weights determined from an implementation of adaptive filtering for precision time protocol with physical layer support in one embodiment.

Referring to FIG. 5, an example of weight coefficient vector W is shown. Note that weight coefficient vector W varies between zero to one, and weight coefficient vector W may vary inversely with variance s(t).

Process 300 can proceed from block 308 to block 310. At block 310, microcontroller 220 can use weight coefficient vector W to update filter coefficients of a filter that can be implemented in DPLL module 224 or in clock servo 234 (e.g., as block 304) being executed by microcontroller 220. The updated coefficients are used to convolute with samples x'(t) in block 304. In one embodiment, filter coefficients 312, that are current values of elements among a filter coefficient vector F, can be stored in a storage element (e.g., memory devices) of slave device 104. Filter coefficients 312 can be a set of coefficients that make up an impulse response of a Proportional Integral (PI) filter (e.g., in DPLL 224 or in clock servo 234) being used for filtering packets. Microcontroller 220 can update filter coefficients 312 by multiplying weight coefficient vector W with filter coefficient vector F, such as:

$$F_i(\text{update})=F_i * W_i$$

where $F_i$(update) denotes the i-th element of an adapted, or updated, filter coefficients vector F(update), and $F_i$ denotes the i-th element (e.g., filter coefficients 312) of filter coefficient vector F.

Referring to FIG. 5, a weight element $W_i$ among weight coefficient vector W being 1.0 (e.g., weight element 500) can indicate that a corresponding filter coefficient can be given maximum weight such that no adaption or changes to the filter coefficient is necessary. For example, if an i-th element of quality vector V (e.g., indicating variance) is zero, or close to zero, (e.g., variance 502 in FIG. 5), then filter coefficient $F_i$ corresponding to an i-th sample among x(t) may be relatively accurate (e.g., having minimal variance). Setting $W_i$ to be 1.0 can cause $F_i$ to be multiplied 1.0, meaning a value of $F_i$ remains unchanged (e.g., $F_i$(updated)=$F_i$).

In one embodiment, slave device 104 can store an accuracy threshold in a storage element (e.g., memory device, or a register file). If a difference between mean(V) and min(V), or mean(V)-min(V), is less than the accuracy threshold, then microcontroller 220 can determine that packet delay variance is relatively small, and filter adaptation (e.g., update of filter coefficients $F_i$) can be disabled and set each and every element of weight coefficient vector W to 1.0.

Process 300 can proceed from block 310 to block 304 by providing adapted filter coefficients vector F(update) to convolution block 304. In one embodiment, the convolution at block 304 can be implemented independently from other blocks of process 300. At block 304, microcontroller 220 can perform a convolution on the selected packets x'(t) and adapted filter coefficients vector F(update) to determine a filtered packet time error sequence y(t), where y(t) can be correction signal 222 shown in FIG. 2:

$$y(t) = \frac{\sum_i (Fi * Wi * x'i)}{\sum Fi * \sum Wi}$$

where $x'_i$ denotes the i-th element of x'(t). In one embodiment, the filter implemented by the convolution at block 304 can be a FIR fixed window filter. The updated filter coefficients F(update) can be used for filtering future packets being received by slave device 104. In one embodiment, as packet delay variations corresponding to the updated filter coefficients F(update) changes again, microcontroller 220 can control clock servo 234 to execute process 300 to further update F(update) and y(t) (e.g., correction signal 222). For example, for every predefined time interval, microcontroller 220 can check whether mean(V)-min(V) is greater than the accuracy threshold. If mean(V)-min(V) is greater than the accuracy threshold, microcontroller 220 can execute process 300 to determine a new weight coefficient vector W and further update filter coefficients. If mean(V)-min(V) is less than the accuracy threshold, microcontroller 220 can maintain a current weight coefficient vector W.

Figure 6:
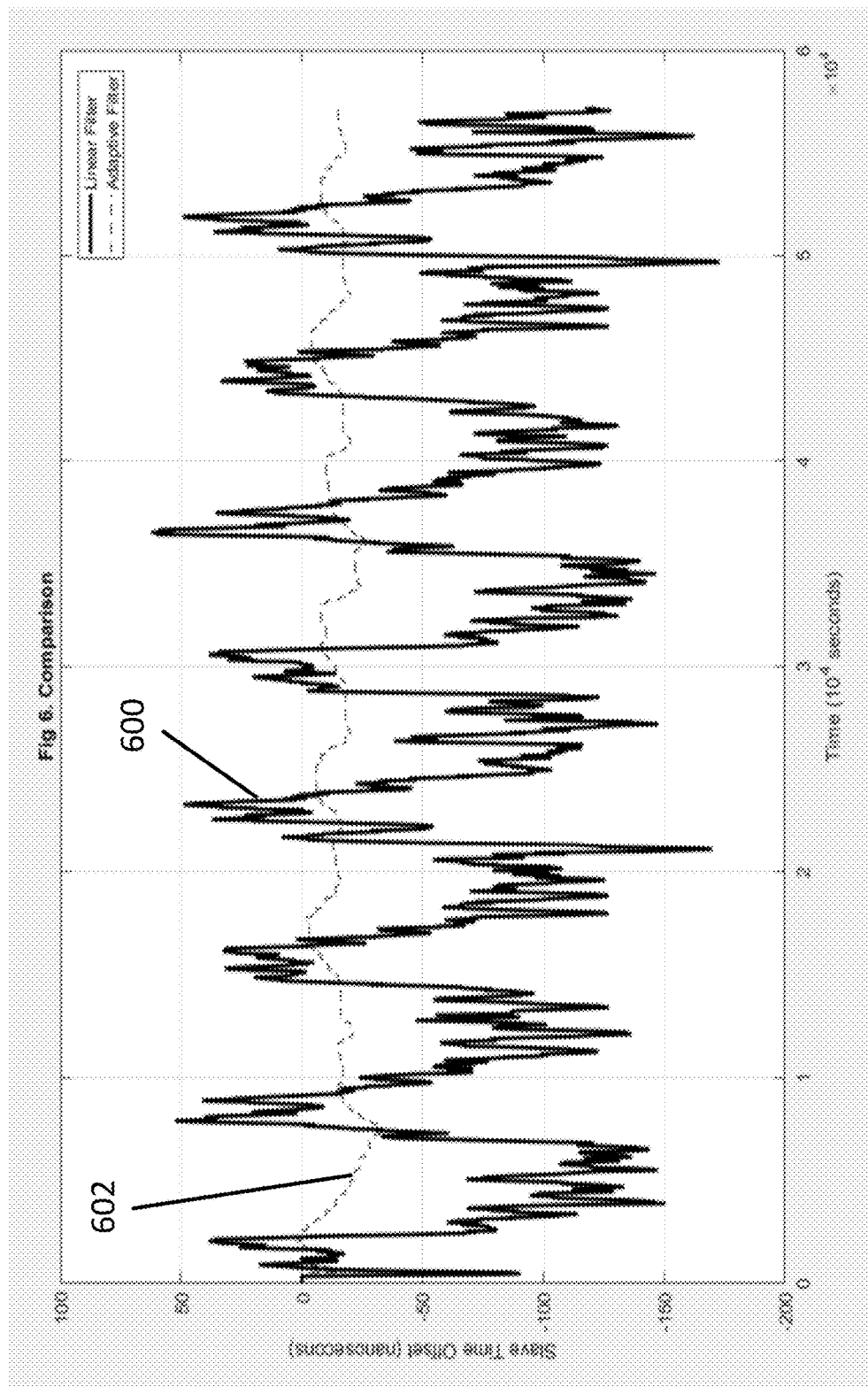
FIG. 6 is a diagram illustrating an example output resulting from an implementation of adaptive filtering for precision time protocol with physical layer support in one embodiment.

FIG. 6 is a diagram illustrating an example output resulting from an implementation of adaptive filtering for precision time protocol with physical layer support in one embodiment. In an example shown in FIG. 6, a waveform 600 shows a recovered slave clock offset resulting from filtering x(t) using a filter with fixed filter coefficients (e.g., a proportional-integral bandwidth filter, or a linear filter with fixed filter coefficients). A waveform 602 shows a recovered slave clock offset resulting from filtering x(t) using adaptive filter with adaptive filter coefficients determined from process 300. Waveform 602 has a variance that is relatively less than waveform 600. The filter coefficient adjustments or adaptations using weights (e.g., weight coefficient vector W) determined based on physical layer support (e.g., SyncE for sliding window size) can cause a slave device to reduce clock offset variations by implementing a filter that adapts to different sample rate, different quality of samples, and different ranges of packet data variation.

Figure 7:
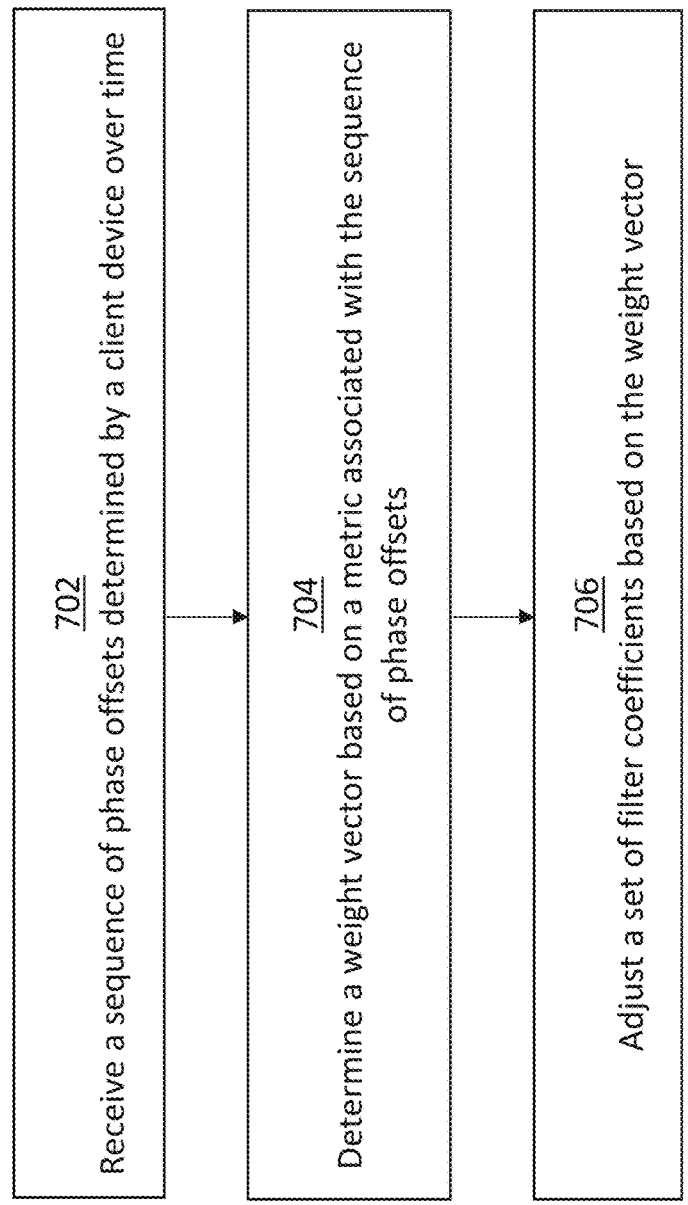
FIG. 7 is a flowchart of an example process that may implement adaptive filtering for precision time protocol with physical layer support according to an embodiment of the disclosure.

FIG. 7 is a flowchart of an example process 700 that may implement adaptive filtering for precision time protocol with physical layer support according to an embodiment of the disclosure. Process 700 can be executed by a microcontroller of a slave device. Process 700 can begin at block 702. At block 702, the microcontroller can receive a sequence of phase offsets determined by a slave device over time. Process 700 can proceed from block 702 to block 704. At block 704, the microcontroller can determine a weight vector based on a metric associated with the sequence of phase offsets. In one embodiment, the microcontroller can perform a statistical analysis to determine the metric.

In one embodiment, the microcontroller can extract a portion of phase offsets from the sequence of phase offsets. The microcontroller can further sample a set of elements from the metric that correspond to the extracted portion of phase offsets. The microcontroller can further form a metric vector based on the sampled set of elements from the metric. The microcontroller can further determine the weight vector based on the metric vector. In one embodiment, the microcontroller can execute a sliding window algorithm to extract the portion of phase offsets. In one embodiment, a size of the sliding window can be based on a physical layer of the slave device. In one embodiment, the microcontroller can normalize the metric vector and saturate the normalized metric vector to determine the weight vector.

In one embodiment, the microcontroller can determine a minimum value of the metric vector. The microcontroller can further determine a mean of the metric vector. The microcontroller can further determine a difference between the mean and the minimum value of the metric vector. The microcontroller can further compare the difference with a threshold. The microcontroller can, in response to the difference being less than the threshold, set every element among the weight vector to a value of one. The microcontroller can, in response to the different being greater than the threshold, saturate a normalization of the metric vector to determine the weight vector.

Process 700 can proceed from block 704 to block 706. At block 706, the microcontroller can adjust a set of filter coefficients based on the weight vector. The set of filter coefficients can be filter coefficients of a filter being implemented by the slave device to filter incoming packet data. In one embodiment, the microcontroller can multiply the weight vector with the set of filter coefficients to adjust the set of filter coefficients.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An integrated circuit that implements adaptive filtering to reduce packet delay variation impact, the integrated circuit comprising:
a microcontroller configured to:
receive a sequence of phase offsets determined by a slave device over time;
form a metric vector based on a set of elements sampled from a metric associated with a portion of phase offsets among the sequence of phase offsets;
determine a weight vector based on the metric vector; and
adjust a set of filter coefficients based on the weight vector, wherein the set of filter coefficients are filter coefficients of a filter being implemented by the slave device to filter incoming packet data.

2. The integrated circuit of claim 1, wherein the microcontroller is configured to perform a statistical analysis to determine the metric.

3. The integrated circuit of claim 1, wherein the microcontroller is configured to:
extract the portion of phase offsets from the sequence of phase offsets; and
sample the set of elements from the metric associated with the portion of phase offsets among the sequence of phase offsets.

4. The integrated circuit of claim 3, wherein the microcontroller is configured to execute a sliding window algorithm to extract the portion of phase offsets.

5. The integrated circuit of claim 4, wherein a size of a sliding window of the sliding window algorithm is based on a physical layer of the slave device.

6. The integrated circuit of claim 1, wherein the microcontroller is configured to:
normalize the metric vector; and
saturate the normalized metric vector to determine the weight vector.

7. The integrated circuit of claim 1, wherein the microcontroller is configured to:
determine a minimum value of the metric vector;
determine a mean of the metric vector;
determine a difference between the mean and the minimum value of the metric vector;
compare the difference with a threshold;
in response to the difference being less than the threshold, set every element among the weight vector to a value of one; and
in response to the different being greater than the threshold, saturate a normalization of the metric vector to determine the weight vector.

8. The integrated circuit of claim 1, wherein the microcontroller is configured to multiply the weight vector with the set of filter coefficients to adjust the set of filter coefficients.

9. A device that implements adaptive filtering to reduce packet delay variation impact, the device comprising:
a physical layer configured to receive packet data from a network; and
a microcontroller configured to be in communication with the physical layer, the microcontroller being configured to:
receive a sequence of phase offsets determined by the device over time;
form a metric vector based on a set of elements sampled from a metric associated with a portion of phase offsets among the sequence of phase offsets;
determine a weight vector based on the metric vector; and
adjust a set of filter coefficients based on the weight vector, wherein the set of filter coefficients are filter coefficients of a filter being implemented by the device to filter packet data received by the physical layer.

10. The device of claim 9, wherein the microcontroller is configured to perform a statistical analysis to determine the metric.

11. The device of claim 9, wherein the microcontroller is configured to:
extract the portion of phase offsets from the sequence of phase offsets; and
sample the set of elements from the metric associated with the portion of phase offsets among the sequence of phase offsets.

12. The device of claim 11, wherein the microcontroller is configured to execute a sliding window algorithm to extract the portion of phase offsets.

13. The device of claim 12, wherein a size of a sliding window of the sliding window algorithm is based on a physical layer of a slave device.

14. The device of claim 9, wherein the microcontroller is configured to:
normalize the metric vector; and
saturate the normalized metric vector to determine the weight vector.

15. The device of claim 9, wherein the microcontroller is configured to:
determine a minimum value of the metric vector;
determine a mean of the metric vector;
determine a difference between the mean and the minimum value of the metric vector;
compare the difference with a threshold;
in response to the difference being less than the threshold, set every element among the weight vector to a value of one; and
in response to the different being greater than the threshold, saturate a normalization of the metric vector to determine the weight vector.

16. The device of claim 9, wherein the microcontroller is configured to multiply the weight vector with the set of filter coefficients to adjust the set of filter coefficients.

17. A method for performing adaptive filtering to reduce phase delay variation impact, the method comprising:
receiving a sequence of phase offsets determined by a slave device over time;
forming a metric vector based on a set of elements sampled from a metric associated with a portion of phase offsets among the sequence of phase offsets;
determining a weight vector based on the metric vector; and
adjusting a set of filter coefficients based on the weight vector, wherein the set of filter coefficients are filter coefficients of a filter being implemented by the slave device to filter incoming packet data.

18. The method of claim 17, further comprising:
extracting the portion of phase offsets from the sequence of phase offsets; and
sampling the set of elements from the metric associated with the portion of phase offsets among the sequence of phase offsets.

19. The method of claim 17, further comprising:
determining a minimum value of the metric vector;
determining a mean of the metric vector;

determining a difference between the mean and the minimum value of the metric vector;

comparing the difference with a threshold;

in response to the difference being less than the threshold, setting every element among the weight vector to a value of one; and in response to the different being greater than the threshold, saturating a normalization of the metric vector to determine the weight vector.

20. The method of claim 17, further comprising multiplying the weight vector with the set of filter coefficients to adjust the set of filter coefficients.

* * * * *